United States Patent [19]

Masuda

[11] 4,182,115
[45] Jan. 8, 1980

[54] ELECTRONIC WRISTWATCH EMPLOYING A FLEXIBLE FILM SUBSTRATE

[75] Inventor: Toshiyuki Masuda, Nara, Japan

[73] Assignee: Sharp Kabushiki Kaisha, Japan

[21] Appl. No.: 834,876

[22] Filed: Sep. 20, 1977

[30] Foreign Application Priority Data

Sep. 20, 1976 [JP] Japan .................................. 51-113283

[51] Int. Cl.² ............................................. G04B 37/00
[52] U.S. Cl. .................................. 58/88 R; 58/23 BA
[58] Field of Search ............... 58/23 R, 23 A, 23 BA, 58/53, 57, 88 R

[56] References Cited

U.S. PATENT DOCUMENTS

| 3,943,699 | 3/1976 | Daniels .................................. 58/23 R |
| 4,015,422 | 4/1977 | Van Haaften ........................ 58/23 R |
| 4,042,861 | 8/1977 | Yasuda .................................. 58/23 R |
| 4,058,970 | 11/1977 | Ichinose ............................... 58/23 R |
| 4,064,688 | 12/1977 | Sasaki .................................. 58/23 R |

Primary Examiner—B. Dobeck
Assistant Examiner—William L. Feeney
Attorney, Agent, or Firm—Birch, Stewart, Kolasch & Birch

[57] ABSTRACT

A CMOS-LSI including a time information keeping circuit and a display driver circuit is mounted on a flexible film substrate. An upper plastic housing and a bottom plastic housing are provided for tightly supporting the flexible film substrate through screws. That is, the flexible film substrate is sandwiched between the two plastic housings at the periphery thereof, thereby minimizing the flexibility of the flexible film substrate.

12 Claims, 1 Drawing Figure

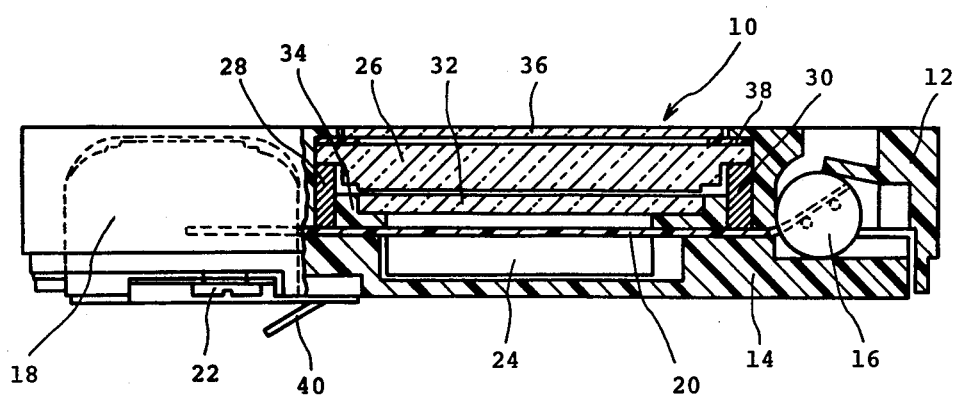

ELECTRONIC WRISTWATCH EMPLOYING A FLEXIBLE FILM SUBSTRATE

BACKGROUND OF THE INVENTION

The present invention relates to an electronic wristwatch and, more particularly, to installation of a flexible film substrate in an electronic wristwatch.

A flexible film substrate has been developed, and a certain type of the electronic calculator employs such a flexible film substrate. See, for example, copending application, ELECTRONIC APPARATUS EQUIPPED ON A FLEXIBLE SUBSTRATUM, Ser. No. 739,002, filed on Nov. 4, 1976 by Takeshi KASUBUCHI, now U.S. Pat. No. 4,104,728 and assigned to the same assignee as the present application (The application Ser. No. 739,002 is a Continuation application of prior application Ser. No. 476,864 filed on June 6, 1974.)

The flexible film substrate is suited for fabricating a thin and small electronic apparatus. Moreover, the flexible film substrate is suited for mass production. Therefore, it is desirable to provide an electronic wristwatch employing a flexible film substrate carrying a CMOS-LSI including a time information keeping circuit and a display driver circuit in order to minimize the thickness of the electronic wristwatch.

However, the flexible film substrate has inherent flexibility. Accordingly, there is a possibility that the CMOS-LSI and wiring patterns formed on the flexible film substrate are damaged when a mechanical shock is applied to the electronic wristwatch, because the flexible film substrate vibrates due to its flexibility.

OBJECTS AND SUMMARY OF THE INVENTION

Accordingly, an object of the present invention is to provide a thin electronic wristwatch.

Another object of the present invention is to provide an electronic wristwatch employing a flexible film substrate.

Still another object of the present invention is to provide an electronic wristwatch employing a CMOS-LSI mounted on a flexible film substrate, the CMOS-LSI including a time information keeping circuit and a display driver circuit.

Yet another object of the present invention is to provide a thin electronic wristwatch which can ensure stable operation and is tolerant of a shock.

A further object of the present invention is to provide novel installation of a flexible film substrate in an electronic wristwatch.

A still further object of the present invention is to provide an electronic timepiece module suited for a thin electronic wristwatch.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a time information keeping circuit and a display driver circuit are incorporated in a single chip CMOS-LSI. The CMOS-LSI is mounted on a flexible substrate made of a polyimide film carrying wiring patterns formed thereon. The flexible substrate is sandwiched between an upper plastic housing and a bottom plastic housing at the periphery thereof. The two plastic housings are tightly fixed to each other through the use of screws and, hence, the flexible substrate is tightly supported by the two plastic housings.

A liquid crystal display unit is installed above the flexible substrate. Electrical communication between the liquid crystal display unit and the flexible substrate is achieved through the use of resilient interconnection such as described in copending application, EXCHANGEABLE LIQUID CRYSTAL PANEL, Ser. No. 562,982, filed on Mar. 28, 1975 by Takehiko SASAKI and Tamotsu KOYAMA and assigned to the same assignee as the present application. The pressure applied to the resilient interconnection is determined by the two plastic housings and is controllable through the use of screws.

BRIEF DESCRIPTION OF THE DRAWINGS

The present invention will be better understood from the detailed description given hereinbelow and the accompanying drawing which is given by way of illustration only, and thus is not limitative of the present invention.

The single FIGURE of the drawing is a partial sectional view of an electronic timepiece module employing an embodiment of a flexible film substrate of the present invention.

DESCRIPTION OF THE PREFERRED EMBODIMENTS

An electronic timepiece module 10 mainly comprises an upper plastic housing 12 and a bottom plastic housing 14. The upper and bottom plastic housings 12 and 14, in combination, define three cavities: first, a cavity for securing a crystal oscillator 16, second, a cavity for securing electronic components, and third, a cavity for securing a power cell 18 therein. The crystal oscillator 16 generates a base frequency signal of which the frequency is 32,768 Hz. The power cell 18 is a silver oxide cell UCC 393, which develops a voltage of 1.5 V, has a capacitance of 75 mAH and has a size of 7.9 mm$\phi$ × 5.33 mmH.

A flexible film substrate 20 is sandwiched between the upper and bottom plastic housings 12 and 14. The flexible film substrate 20 is made of a polyimide film carrying wiring patterns formed thereon. The flexible film substrate 20 is tightly supported by the upper and bottom plastic housings 12 and 14 at the periphery thereof. The pressure applied between the upper and bottom plastic housings 12 and 14 is controlled through the use of screws 22. Although only one screw is illustrated in the drawing, there are five screws to tightly fix the upper and bottom plastic housings 12 and 14 to each other.

A CMOS-LSI 24 is mounted on the flexible film substrate 20 at the center thereof. The CMOS-LSI 24 includes a time information keeping circuit and a display driver circuit for performing the timepiece function. Desired portions of the flexible film substrate 20 are extended toward the crystal oscillator 16 and the power cell 18 for electrical communication purposes.

A field effect mode liquid crystal display unit 26 is disposed above the flexible film substrate 20 to achieve time information display. Electrical communication is achieved between the field effect mode liquid crystal display 26 and the flexible film substrate 20 through resilient interconnections 28 and 30 made of conductive rubber and insulative rubber. The resilient interconnections 28 and 30 are tightly supported between the field effect mode liquid crystal display 26 and the flexible film substrate 20 through the use of the upper and bottom plastic housings 12 and 14, and the screws 22.

Detailed constructions of the resilient interconnections 28 and 30 are described in copending application, EXCHANGEABLE LIQUID CRYSTAL PANEL, Ser. No. 562,982, filed on Mar. 28, 1975 by Takehiko SASAKI and Tamotsu KOYAMA and assigned to the same assignee as the present application.

A scattering plate 32 is mounted on a frame 34. The scattering plate 32 is associated with a lamp (not shown) for illuminating the field effect mode liquid crystal display 26 in the dark environment. Detailed constructions of the scattering plate 32 are described in copending applicaiton, SCATTERING PLATE FOR USE IN AN ELECTRO-OPTICAL DISPLAY HAVING AN ILLUMINATION LAMP, Ser. No. 707,633, filed on July 22, 1976 by Hiroshi INOUE, Shigeru MAGOORI and Tadashi NAKAJIMA and assigned to the same assignee as the present application.

An ultraviolet filter 36 is provided above the field effect mode liquid crystal display 26 via a seat 38 to enhance the display quality.

The electronic timepiece module 10 has a size of 30.90 mm + 5.80 mm thickness. The electronic timepiece module 10 is installed within a conventional metal watch casing. A metal leaf 40 functions to ground the electronic components via a rear metal casing of the watch.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An electronic timepiece comprising:
a first support means containing a digital display on a surface threof;
a second support means provided in a spaced relationship with said first means;
said first and second support means provided for accommodating a discrete module of the electronic timepiece implemented with a semiconductor element;
a flexible film substrate carrying said semiconductor element of said electronic timepiece and wiring patterns;
means for tightly sandwiching said flexible film substrate between a portion of said digital display carrying said first support means and a portion of said second support means for holding purposes, said flexible film substrate being held in direct contact with each of said portions of said first and second support means;
a resilient means for holding said flexible film substrate; and
said resilient means functioning to provide electrical interconnection between the digital display and said wiring patterns of said flexible film substrate.

2. The electronic timepiece according to claim 1, wherein a peripheral portion of said flexible film substrate is free to provide electrical contact with at least one electrical component.

3. An electronic timepiece comprising:
an upper insulating housing containing a digital display on a surface thereof so as to direct said digital display toward an outside surface thereof;
a bottom insulating housing having a recess for containing a semiconductor element therein;
said upper and bottom insulating housings provided for constituting a discrete module of the electronic timepiece;
a flexible film substrate carrying wiring patterns thereon;
means for tightly sandwiching said flexible film substrate between a portion of said upper insulating housing and a portion of said bottom insulating housing for holding purposes, said flexible film substrate being held in direct contact with each of said portions of said upper and lower insulating housings;
resilient means inboard of said means for sandwiching for resiliently holding said flexible film substrate; and
said resilient means functioning to provide electrical interconnection between the digital display and said wiring patterns of said flexible film substrate.

4. The electronic timepiece according to claim 3, wherein said upper and bottom insulating housings are made of plastic.

5. The electronic timepiece according to claim 3, wherein said flexible film substrate is made of a synthetic resin, said resin comprising a polyimide.

6. The electronic timepiece according to claim 3, further comprising a semiconductor element disposed in said recess, said semiconductor element being a CMOS-LSI.

7. The electronic timepiece according to claim 3, wherein said digital display is a liquid crystal display.

8. The electronic timepiece according to claim 3, wherein said upper and bottom insulating housings, in combination, further define a cavity means for securing a power cell.

9. The electronic timepiece according to claim 3, wherein said upper and bottom insulating housings are tightly fixed to each other by securing means, said securing means comprising a screw; and
wherein said flexible film substrate is tightly supported by said upper and bottom insulating housings at a periphery thereof.

10. The electronic timepiece according to claim 3, wherein a peripheral portion of said flexible film substrate is free to provide electrical contact with at least one electrical component.

11. An electronic timepiece comprising:
an upper insulating housing containing a digital display on the surface thereof so as to direct said digital display toward the outside thereof, the upper insulating housing having projection means extending toward the inside of said electronic timepiece;
a bottom insulating housing including a recess for containing a semiconductor element, the bottom insulating housing having projection means extending toward the inside of said electronic timepiece;
said upper and bottom insulating housings provided for constituting a distinct module of said electronic timepiece;

a flexible film substrate carrying wiring patterns thereon;

means for sandwiching said flexible film substrate between the projection means of said upper insulating housing and the projection means of said bottom insulating housing for holding purposes, said flexible film substrate being held in direct contact with each of said projection means;

resilient means inboard of said means for sandwiching for resiliently holding said flexible film substrate; and said resilient means functioning to provide electrical interconnection between the digital display and said wiring patterns of said flexible film substrate.

12. The electronic timepiece according to claim 11, wherein a peripheral portion of said flexible film substrate is free to provide electrical contact with at least one electrical component.

* * * * *